US009398713B2

(12) United States Patent
Chen et al.

(10) Patent No.: US 9,398,713 B2
(45) Date of Patent: Jul. 19, 2016

(54) ELECTRONIC APPARATUS

(71) Applicant: BEIJING BOE OPTOELECTRONICS TECHNOLOGY CO., LTD., Beijing (CN)

(72) Inventors: Zhiyong Chen, Beijing (CN); Zhuang Wang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 272 days.

(21) Appl. No.: 13/967,526

(22) Filed: Aug. 15, 2013

(65) Prior Publication Data

US 2014/0049885 A1 Feb. 20, 2014

(30) Foreign Application Priority Data

Aug. 16, 2012 (CN) ...................... 2012 2 0406071 U

(51) Int. Cl.

*G06F 3/042* (2006.01)
*H05K 7/00* (2006.01)
*G06F 1/16* (2006.01)
*G06F 3/03* (2006.01)

(52) U.S. Cl.

CPC ................ *H05K 7/00* (2013.01); *G06F 1/1626* (2013.01); *G06F 3/0421* (2013.01); *G06F 3/0304* (2013.01); *G06F 3/0308* (2013.01); *G06F 3/0325* (2013.01); *G06F 3/0428* (2013.01)

(58) Field of Classification Search

CPC ... G06F 1/1626; G06F 3/0428; G06F 3/0304; G06F 3/0308; G06F 3/0325; G06F 3/042; G06F 3/0421

USPC ........... 345/173, 175; 178/18.09; 361/679.01, 361/679.02

See application file for complete search history.

(56) References Cited

U.S. PATENT DOCUMENTS 8,917,239 B2 * 12/2014 Eriksson et al. .............. 345/156
2010/0053861 A1 * 3/2010 Kim et al. ................ 361/679.01
2010/0315337 A1 * 12/2010 Ferren et al. ................. 345/158
2011/0169775 A1 * 7/2011 Liaw et al. .................... 345/175

* cited by examiner

*Primary Examiner* — Jimmy H Nguyen

(74) *Attorney, Agent, or Firm* — Ladas & Parry LLP

(57) ABSTRACT

Embodiment of the invention discloses an electronic apparatus. A frame of the electronic apparatus comprises a sense region, and at least one sense window is provided in the sense region. A reflection type optical emitter-receiver-tube is provided at a position inside the electronic apparatus corresponding to the sense window, and an output terminal of the optical emitter-receiver-tube is connected with a processor inside the electronic apparatus.

10 Claims, 3 Drawing Sheets

41
42
50
80
90
Processor
60
R1
R2
70

ELECTRONIC APPARATUS

BACKGROUND

Recently, touch screen is widely employed in various electronic apparatuses. By way of example, typical electronic apparatuses provided with the touch screen include mobile phone, tablet computer, e-book, portable media player, etc. Users conduct various hand operations, such as single-click, double-click, slide and the like, on the touch screen of the electronic apparatus so as to control the electronic apparatus and handle various tasks.

However, repeating hand operations on the touch screen may result in long time contact of the fingers with the touch screen, which may leave dirty marks and/or oil stains on the touch screen, thus the appearance and the sanitation condition of the electronic apparatus are adversely affected. Cleaning of the touch screen is a time-consuming and painful task. Furthermore, the touch screen is prone to be damaged by frequent hand operations thereon.

SUMMARY

Embodiment of the invention discloses an electronic apparatus. A frame of the electronic apparatus comprises a sense region, and at least one sense window is provided in the sense region. A reflection type optical emitter-receiver-tube is provided at a position inside the electronic apparatus corresponding to the sense window, and an output terminal of the optical emitter-receiver-tube is connected with a processor inside the electronic apparatus.

In the embodiments of the invention, the sense region with at least one sense window provided therein is provided on the frame of the electronic apparatus, the reflection type optical emitter-receiver-tube provided inside the electronic apparatus emits and receives the sense light through the sense window, and thus whether there is the touch operation and the details of the touch operation can be determined.

In the electronic apparatus in accordance with the embodiments of the invention, the touch operations conducting on the sense region may be of various forms so that a majority of the hand operations on the touch screen, such as single click, double click, slide, zoom in, zoom out and the like, can be replaced. With the electronic apparatus according to the embodiments of the invention, the contact time of the finger or any other subject with the touch screen can be reduced, and thus the problem that the touch screen is easy to be stained and damaged can be solved. In addition, the electronic apparatus in accordance with the embodiments of the invention has other advantages such as a simpler structure, a lower cost, a shorter response time, an improved operability and a better practicability.

DETAILED DESCRIPTION OF THE PREFERRED EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
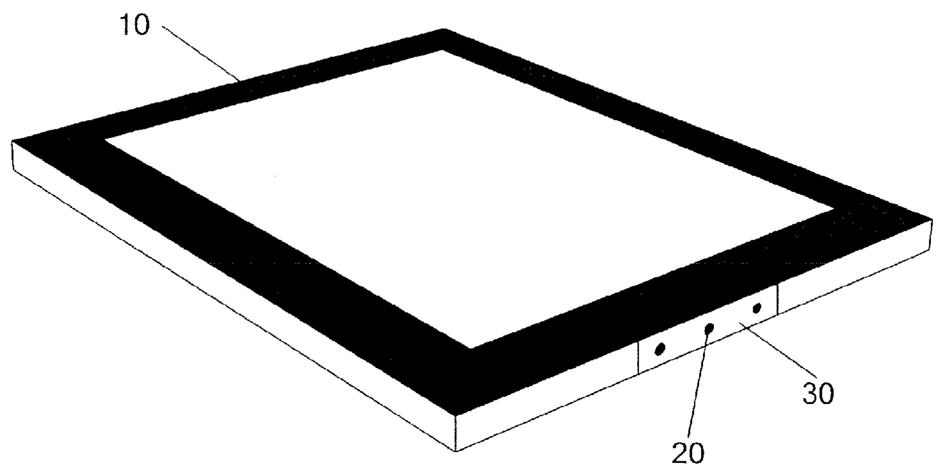
FIG. 1 is a structure view of an electronic apparatus in accordance with the embodiments of the invention.

The embodiments of the invention provide an electronic apparatus. As shown in FIG. 1, a frame of the electronic apparatus 10 comprises a sense region 30, and at least one sense window 20 is provided in the sense region 30. For example, there are three sense windows 20 as shown in FIG. 1. A reflection type optical emitter-receiver-tube (not shown) is provided at a position inside the electronic apparatus 10 corresponding to the sense window 20. An output terminal of the optical emitter-receiver-tube is connected with a processor (see FIG. 6) inside the electronic apparatus 10. For example, the processor is a CPU. The number of the reflection type optical emitter-receiver-tube is equal to that of the sense window 20. For example, in the case that there are three sense windows 20 as shown in FIG. 1, three optical emitter-receiver-tubes are provided to correspond to the three sense windows 20 one by one.

The sense region 30 is a part of the frame, and may be provided on a front side of the frame, a rear side of the frame that is opposite to the front side, or other sides of the frame. For example, in the electronic apparatus shown in FIG. 1, the sense region 30 is provided on a right side of the frame. By way of example, the sense region 30 is provided on the right side of the frame as well in the following descriptions unless further explanation is made. In addition, the frame of the electronic apparatus 10 refers to the outer casing of the electronic apparatus 10, or more specifically, it refers to the part of the outer casing of the electronic apparatus 10 except for the touch screen.

In the case that there are multiple sense windows 20, the sense windows 20 may be provided in a specific arrangement manner in the sense region 30. The specific arrangement manner may be of various forms. For example, the sense windows 20 may be provided at equal distances. It should be noted that, the arrangement manner of the sense windows 20 is not limited, and any other arrangement manners based on the practical applications belong to the scope of the invention as well.

Figure 2:
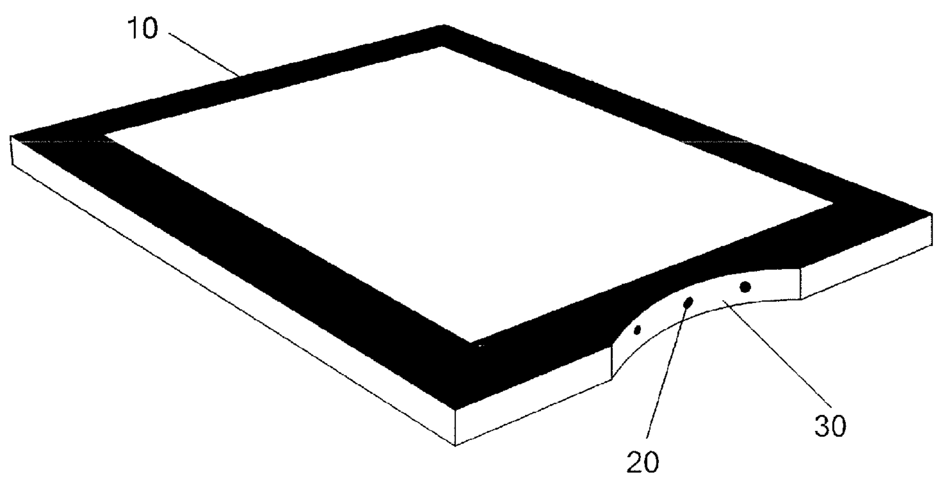
FIG. 2 is a structure view of another electronic apparatus in accordance with the embodiments of the invention.
Figure 3:
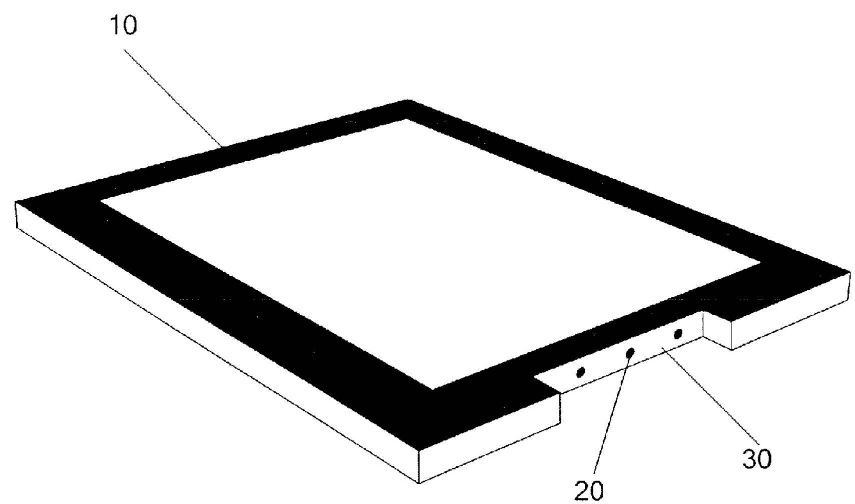
FIG. 3 is a structure view of still another electronic apparatus in accordance with the embodiments of the invention.

It should be noted that the sensor region 30 may be of any structures. For example, it may be of a straight-edge structure as shown in FIG. 1, or may be of a recess structure. In addition, the recess structure of the sense region 30 may be of various forms. For example, the recess structure of the sense region 30 may be an arc recess as shown in FIG. 2, a trapezoid recess as shown in FIG. 3, etc. It should be noted that, the recess structure of the sense region 30 is not limited to the two forms shown in FIG. 2 and FIG. 3, and any other forms of the recess structure that can achieve the object of the invention belongs to the scope of the invention as well.

Figure 4:
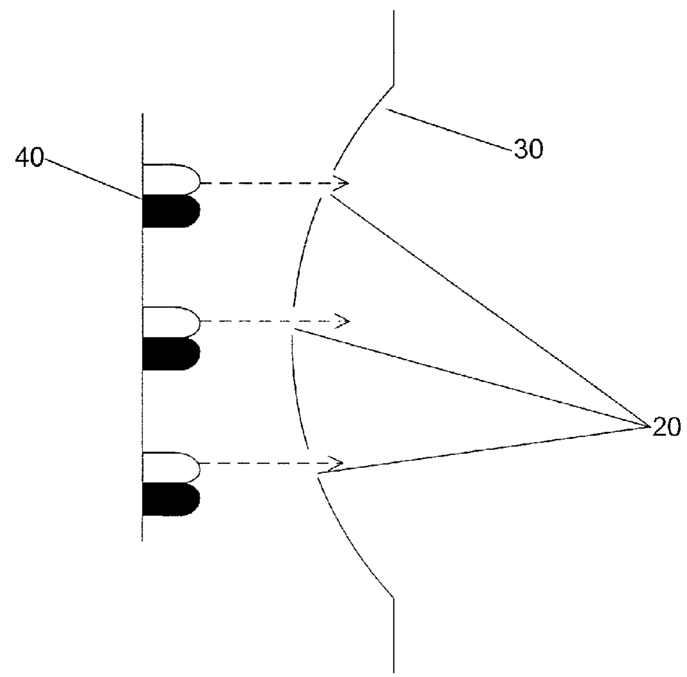
FIG. 4 is a schematic view showing the positional relationship between a reflection type optical emitter-receiver-tube and a sense window in accordance with the embodiments of the invention.

By way of example, the positional relationship between the reflection type optical emitter-receiver-tube and the sense window will be described in details below with reference to FIG. 2 and FIG. 4. As mentioned above, the sense region 30 of the electronic apparatus 10 in FIG. 2 has the arc recess structure. As shown in FIG. 4, a plurality of sense windows 20 are provided in the sense region 30, and the reflection type optical emitter-receiver-tubes 40 inside the electronic apparatus 10 are disposed to correspond to the sense windows 20 one by one. For example, the portion of the frame of the electronic apparatus 10 at the sense region 30 is punched to form through holes and each through hole is referred as the sense window 20. The position of the reflection type optical emitter-receiver-tube 40 corresponds to that of the sense window 20, such that the sense light emitted by the reflection type optical emitter-receiver-tube 40 can travel to the exterior through the sense window 20 and the sense light can be reflected back to the reflection type optical emitter-receiver-tube 40 through the sense window 20.

Figure 5A:
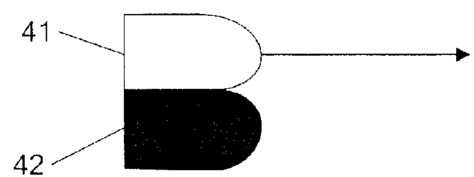
FIG. 5*a* is a schematic view showing the operation principle of the optical emitter-receiver-tube in accordance with the embodiments of the invention.
Figure 5B:
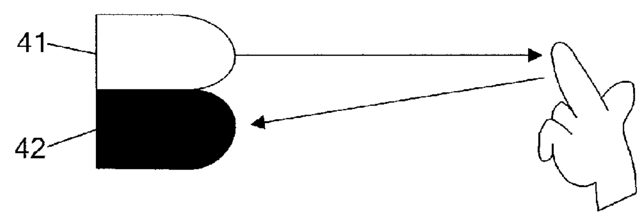
FIG. 5*b* is another schematic view showing the operation principle of the optical emitter-receiver-tube in accordance with the embodiments of the invention.

The structure and operation principle of the reflection type optical emitter-receiver-tube 40 are shown in FIGS. 5*a* and 5*b*. Each reflection type optical emitter-receiver-tube 40 comprises an emitter 41 and a receiver 42. The emitter 41 and the receiver 42 are integrated together to form the reflection type optical emitter-receiver-tube 40. The emitter 41 is used to emit the sense light, while the receiver 42 is used to receive the sense light that is reflected. In the state as shown in FIG. 5*a*, there is no touch operation on the sense region 30, the receiver 42 does not receive the sense light emitted by the emitter 41, that is, the sense light emitted by the emitter 41 is not reflected back to the receiver 42. In the state as shown in FIG. 5*b*, there is a touch operation on the sense region 30, the receiver 42 receives the sense light emitted by the emitter 41, that is, the sense light emitted by the emitter 41 is reflected back by the finger of the user and reaches the receiver 42 through the corresponding sense window 20.

Figure 6:
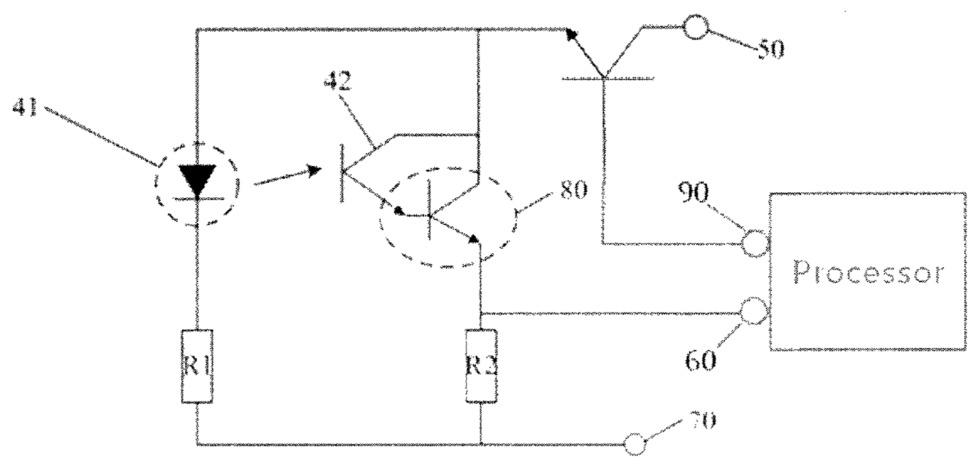
FIG. 6 is a circuit diagram of the optical emitter-receiver-tube in accordance with the embodiments of the invention.

The circuit diagram of the reflection type optical emitter-receiver-tube 40 is shown in FIG. 6. The reference number 50 refers to an input terminal of the reflection type optical emitter-receiver-tube 40 and is also called as a VCC terminal. The reference number 60 refers to an output terminal of the reflection type optical emitter-receiver-tube 40 and is also called as an OUT terminal. The reference number 70 refers to a ground terminal of the reflection type optical emitter-receiver-tube 40 and is also called as a GND terminal. When the receiver 42 receives the sense light emitted by the emitter 41, the triode 80 connected with the receiver 42 is turned on and the output terminal 60 of the reflection type optical emitter-receiver-tube 40 outputs a high level. When the receiver 42 does not receive the sense light emitted by the emitter 41, the triode 80 connected with the receiver 42 is turned off and the output terminal 60 of the reflection type optical emitter-receiver-tube 40 outputs a low level. The processor connected with the output terminal 60 of the reflection type optical emitter-receiver-tube 40 determines whether there is the touch operation by monitoring the output terminal 60. That is, the processor determines that there is the touch operation in the case that the high level is output from the output terminal 60 and thus conducts a corresponding operation based on the touch operation; and the processor determines that there is not the touch operation in the case that the low level is output from the output terminal 60.

In addition, the reflection type optical emitter-receiver-tube in the embodiments of the invention may be a reflection type infrared optical emitter-receiver-tube, a reflection type laser optical emitter-receiver-tube, etc. The reflection type infrared optical emitter-receiver-tube emits infrared light, while the reflection type laser optical emitter-receiver-tube emits laser light. However, the reflection type optical emitter-receiver-tube in the embodiments of the invention are not limited to the reflection type infrared transistor and the reflection type laser optical emitter-receiver-tube, and any other reflection type optical emitter-receiver-tubes that can achieve the object of the invention belongs to the scope of the invention as well.

It should be noted that, the electronic apparatus according to the embodiments of the invention may control the intensity of the sense light emitted by the emitter of the reflection type optical emitter-receiver-tube so as to control the propagation distance of the sense light. In order that the touch operation is efficiently recognized and the receiver receives the reflected sense light with enough amount, the sense light should have enough intensity so that it is emitted beyond the sense window by a certain distance. For the electronic apparatus shown in FIG. 1 in which the sense region 30 is of the straight-edge structure, because the sense light is emitted beyond the frame of the electronic apparatus, a touch sense may be triggered when the electronic apparatus is picked up or put down or when the sense region is close to other subjects, and thus a misoperation occurs.

Such misoperation may be avoided by providing a control switch in the electronic apparatus to control the emission of the sense light. For example, as shown in FIG. 6, a terminal of the control switch is connected with the processor. With such control switch, the sense light is emitted when the sense region is needed to sense the touch operation whereas the sense light is not emitted when the sense region is not needed to sense the touch operation.

Compared with the electronic apparatus shown in FIG. 1, the electronic apparatuses shown in FIGS. 2 and 3 can avoid the above-mentioned misoperations better due to the recess structure of the sense region 30. Since the sense window is provided in the recess in FIG. 2 and FIG. 3, the sense light may not be emitted beyond the recess by adjusting the intensity of the sense light so that the touch operation is not triggered unless the finger or any other subject is inserted into the recess, and thus the misoperations can be avoided efficiently and the accuracy of the touch operation can be ensured. Furthermore, the arc recess structure is more suitable to the finger operation of the user in practical applications, and thus the structure of the electronic apparatus shown in FIG. 2 is a preferable structure. Of course, the control switch described above with respect to FIG. 1 may be applied to the electronic apparatuses shown in FIG. 2 and FIG. 3 as well.

It should be noted that the reflection type optical emitter-receiver-tubes may be used independently with each optical emitter-receiver-tube having a corresponding function, or they may be used in combination with each combination having a corresponding function. For example, two or three or more than three optical emitter-receiver-tubes may be used in combination. The direction of the touch operation, such as slide upward, slide downward, zoom in, zoom out and the like, may be determined by the sensing order of the receivers. The speed of the touch operation may be determined by the time interval between the sensing times of the receivers. A shorter time interval means a faster touch operation while a longer time interval means a slower touch operation. Of course, a time threshold should be set, such that the touch operation with the time interval larger than the time threshold is recognized as a single click operation while the touch operation with the time interval smaller than the time threshold is recognized as a sliding operation or other operations. The touch operations and their corresponding functions may be set depending on the practical requirements.

In the embodiments of the invention, the sense region with at least one sense window provided therein is provided on the frame of the electronic apparatus, the reflection type optical emitter-receiver-tube provided inside the electronic apparatus emits and receives the sense light through the sense window, and thus whether there is the touch operation and the details of the touch operation can be determined. In the electronic apparatus in accordance with the embodiments of the invention, the touch operations conducting on the sense region may be of various forms so that a majority of the hand operations on the touch screen, such as single click, double click, slide, zoom in, zoom out and the like, can be replaced. With the electronic apparatus according to the embodiments of the invention, the contact time of the finger or any other subject with the touch screen can be reduced, and thus the problem that the touch screen is easy to be stained and damaged can be solved. In addition, the electronic apparatus in accordance with the embodiments of the invention has other advantages such as a simpler structure, a lower cost, a shorter response time, an improved operability and a better practicability.

The embodiments of the invention have been described with respect to the electronic apparatus with the touch screen. However, for an electronic apparatus without the touch screen, the embodiments of the invention may also be employed to implement some functions.

The foregoing are only preferable embodiments of the invention. It is to be noted that, those with ordinary skills in the art may make various modifications and changes without departing the technical principle of the invention, and these modifications and changes should be deemed to be within the protection scope of the invention.

What is claimed is:

1. An electronic apparatus comprising:

a frame comprising a sense region, at least one sense window provided in the sense region;

a reflection type optical emitter-receiver-tube provided at a position inside the electronic apparatus corresponding to the sense window, and an output terminal of the optical emitter-receiver-tube connected with a processor inside the electronic apparatus; and a control switch to control light emission of an emitter of the optical emitter-receiver-tube, wherein the control switch includes a control terminal connected with the processor, an input terminal connected to a voltage, and an output terminal connected to the emitter and wherein the processor controls an activation of the control switch to cause the emitter to emit sense light when the sense region is needed to sense a touch operation and a deactivation of the control switch to cause the emitter to do not emit the sense light when the sense region is not needed to sense the touch operation.

2. The electronic apparatus according to claim 1, wherein the sense region is of a straight-edge structure or a recess structure.

3. The electronic apparatus according to claim 2, wherein the recess structure is an arc recess or a trapezoid recess.

4. The electronic apparatus according to claim 2, wherein the recess structure is a trapezoid recess.

5. The electronic apparatus according to claim 2, wherein the sense window is provided in the recess structure, a sense light emitted from the optical emitter-receiver-tube cannot be emitted beyond the recess structure by adjusting an intensity of the sense light.

6. The electronic apparatus according to claim 1, wherein the reflection type optical emitter-receiver-tube is a reflection type infrared optical emitter-receiver-tube or a reflection type laser optical emitter-receiver-tube.

7. The electronic apparatus according to claim 1, wherein the sense region is provided on a front side of the frame, a rear side of the frame that is opposite to the front side, or other sides of the frame.

8. The electronic apparatus according to claim 1, wherein the reflection type optical emitter-receiver-tube comprises the emitter and a receiver.

9. The electronic apparatus according to claim 1, wherein the sense window is a through hole passing through the frame at the sense region.

10. The electronic apparatus according to claim 1, wherein there are a plurality of the sense windows and these sense windows are arranged at equal distances.

* * * * *